United States Patent
Zheng (10) Patent No.: US 11,573,145 B2
(45) Date of Patent: Feb. 7, 2023

(54) CAPACITIVE MEMS PRESSURE SENSOR AND METHOD OF MANUFACTURE

(71) Applicant: Rosemount Aerospace Inc., Burnsville, MN (US)

(72) Inventor: Jun Zheng, Edina, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 105 days.

(21) Appl. No.: 17/180,688

(22) Filed: Feb. 19, 2021

(65) Prior Publication Data

US 2021/0302253 A1    Sep. 30, 2021

Related U.S. Application Data

(60) Provisional application No. 63/003,055, filed on Mar. 31, 2020.

(51) Int. Cl.
| | | |
|---|---|---|
| *G01L 9/00* | (2006.01) | |
| *G01L 9/12* | (2006.01) | |
| *B81B 3/00* | (2006.01) | |

(52) U.S. Cl.
CPC ............ *G01L 9/12* (2013.01); *B81B 3/0018* (2013.01); *B81B 2201/0264* (2013.01)

(58) Field of Classification Search
CPC ....... G01L 9/12; G01L 9/0048; G01L 9/0073; B81B 3/0018; B81B 2201/0264
See application file for complete search history.

(56) References Cited

U.S. PATENT DOCUMENTS

| | | | | |
|---|---|---|---|---|
| 4,730,496 A | * | 3/1988 | Knecht ................. | G01L 9/0073 361/283.4 |
| 5,134,887 A | * | 8/1992 | Bell ....................... | G01L 9/0042 361/283.4 |
| 5,145,810 A | * | 9/1992 | Matsumi ............. | B81C 1/00246 438/977 |

(Continued)

FOREIGN PATENT DOCUMENTS

| | | |
|---|---|---|
| EP | 2653443 A2 | 10/2013 |
| EP | 3557212 A1 | 10/2019 |
| WO | 0153789 A1 | 7/2001 |

OTHER PUBLICATIONS

Extended European Search Report for EP Application No. 21165345.6, dated Aug. 25, 2021, 8 pages.

*Primary Examiner* — David J Bolduc
(74) *Attorney, Agent, or Firm* — Kinney & Lange, P.A.

(57) ABSTRACT

A method of fabricating a capacitive micromechanical electrical system (MEMS) pressure sensor includes the steps of forming a backing wafer, forming a diaphragm wafer that includes a diaphragm configured to deflect from an applied force and a pressure cavity configured to produce on the diaphragm the applied force which is indicative of a system pressure; fusing the diaphragm wafer to the backing wafer thereby forming a base wafer, forming a top wafer, joining the top wafer to the base wafer, thereby forming a detector wafer. The diaphragm defines a first capacitor surface and the top wafer defines a second capacitor surface. A void separates the second capacitor surface from the first capacitor surface by a separation distance which is a capacitor gap. A capacitive MEMS pressure sensor is also disclosed.

15 Claims, 6 Drawing Sheets

(56) References Cited

U.S. PATENT DOCUMENTS

| | | | | |
|---|---|---|---|---|
| 5,295,395 A | * | 3/1994 | Hocker | G01L 9/0073 |
| | | | | 92/103 SD |
| 5,675,086 A | * | 10/1997 | Kihara | G01L 13/026 |
| | | | | 361/283.4 |
| 5,695,590 A | | 12/1997 | Willcox et al. | |
| 5,954,850 A | | 9/1999 | Bernot et al. | |
| 8,387,464 B2 | | 3/2013 | McNeil et al. | |
| 8,627,559 B2 | * | 1/2014 | Suminto | G01L 9/0055 |
| | | | | 361/283.4 |
| 9,783,411 B1 | * | 10/2017 | Potasek | B81B 3/0081 |
| 9,878,904 B1 | * | 1/2018 | Potasek | B81C 1/0023 |
| 10,065,851 B2 | | 9/2018 | Bryzek | |
| 2003/0150275 A1 | * | 8/2003 | Wagner | G01L 19/146 |
| | | | | 73/715 |
| 2005/0076719 A1 | * | 4/2005 | Jakobsen | B81B 7/007 |
| | | | | 73/718 |
| 2009/0255343 A1 | * | 10/2009 | Uehara | G01L 9/0073 |
| | | | | 73/724 |
| 2011/0209554 A1 | * | 9/2011 | Miyashita | G01L 9/0073 |
| | | | | 156/257 |
| 2013/0276544 A1 | * | 10/2013 | Potasek | B81B 7/0048 |
| | | | | 73/715 |
| 2016/0033349 A1 | * | 2/2016 | Abed | G01L 9/0051 |
| | | | | 257/419 |
| 2016/0178467 A1 | * | 6/2016 | Terry | G01L 9/0051 |
| | | | | 257/419 |
| 2016/0244326 A1 | * | 8/2016 | Bretthauer | B81C 1/00904 |
| 2016/0370242 A1 | | 12/2016 | Duqi et al. | |
| 2019/0323912 A1 | | 10/2019 | Zheng | |
| 2022/0099512 A1 | * | 3/2022 | Yoshikawa | H01L 23/544 |

* cited by examiner

CAPACITIVE MEMS PRESSURE SENSOR AND METHOD OF MANUFACTURE

CROSS-REFERENCE TO RELATED APPLICATION(S)

This application claims the benefit of U.S. Provisional Patent Application No. 63/003,055 filed on Mar. 31, 2020, which is incorporated by reference herein.

This application is related to U.S. patent application Ser. No. 15/956,657, entitled "HIGH TEMPERATURE CAPACITIVE MEMS PRESSURE SENSOR", filed on Apr. 18, 2018.

BACKGROUND

The present disclosure relates to pressure sensors, and in particular, to a capacitive micromechanical electrical system (MEMS) pressure sensor.

Electronic capacitive pressure sensors are known in the art for providing an indication of a system pressure that acts on a flexible diaphragm, thereby changing the electrical capacitance of a capacitor circuit that is formed by the diaphragm and a reference body. Borosilicate glass (marketed as PYREX™) is known as a component of capacitive pressure sensors of the prior art that are used in many applications, including automotive, aerospace, and industrial control applications. For example, metalized borosilicate glass can be used to form an electrical capacitor structure in a capacitive pressure sensor. Because of the relatively small physical size of a capacitive pressure sensor, the batch manufacturing of multiple capacitive pressure sensors on a borosilicate glass (i.e., PYREX™) wafer provides an economic means of mass-producing capacitive pressure sensors.

Despite the relatively good performance of borosilicate glass based capacitive pressure sensors, there are opportunities for improvement. For example, when used in a cold environment, a phenomenon known as cold jump results from the physical property of borosilicate glass, which can affect sensor accuracy. While using a thinner borosilicate glass can mitigate the effect of cold jump, the thinner glass can increase the manufacturing complexity. Configuring a capacitive pressure sensor as an absolute pressure detector requires the creation of a vacuum seal in the sensor packaging, which can increase the manufacturing cost. Moreover, the future supply chain of borosilicate glass wafers is uncertain, which can affect the pricing and/or availability of borosilicate glass wafers. Accordingly, it can be beneficial to have an alternative design for a capacitive pressure sensor that is not based on borosilicate glass, while also having a highly-accurate design that can facilitate a cost-effective manufacturing process.

SUMMARY

A method of fabricating a capacitive MEMS pressure sensor includes the steps of forming a backing wafer, forming a diaphragm wafer that includes a diaphragm configured to deflect from an applied force, and a pressure cavity configured to produce on the diaphragm the applied force which is indicative of a system pressure; fusing the diaphragm wafer to the backing wafer thereby forming a base wafer, forming a top wafer, joining the top wafer to the base wafer, thereby forming a detector wafer. The diaphragm defines a first capacitor surface and the top wafer defines a second capacitor surface. A void separates the second capacitor surface from the first capacitor surface by a separation distance which is a capacitor gap.

A capacitive MEMS pressure sensor includes a backing wafer, a diaphragm wafer that includes a diaphragm configured to deflect from an applied force, and a pressure cavity configured to produce on the diaphragm the applied force which is indicative of a system pressure, and a top wafer. The diaphragm defines a first capacitor surface and the top wafer defines a second capacitor surface. A void separates the second capacitor surface from the first capacitor surface by a separation distance which is a capacitor gap.

DETAILED DESCRIPTION

Figure 1:
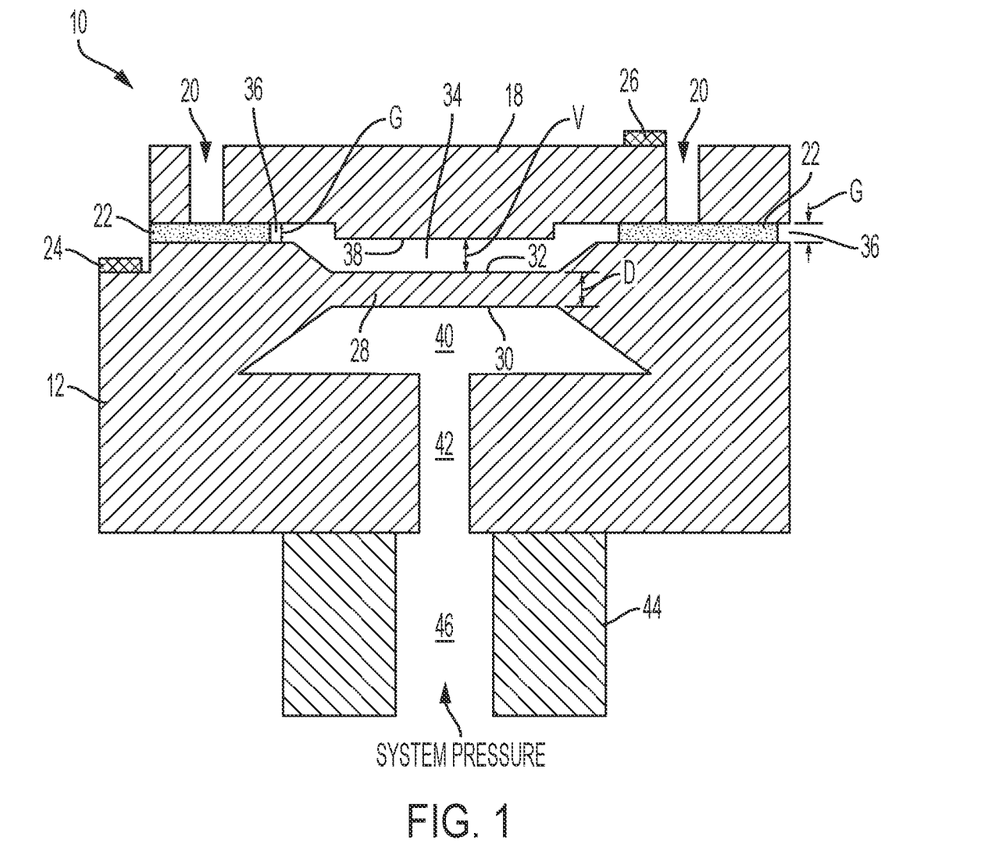
FIG. 1 is a cross-sectional side view of a capacitive MEMS pressure sensor.

The micromechanical pressure sensor of the present disclosure provides utilizes a capacitive micromechanical electrical system (MEMS). An exemplary embodiment utilizes silicon as the structure of the MEMS structure. FIG. 1 is a cross-sectional side view of a capacitive MEMS pressure sensor. Shown in FIG. 1 are capacitive MEMS pressure sensor 10, base 12, top 18, trench 20, glass frit 22, lower electrode 24, upper electrode 26, diaphragm 28, diaphragm pressure side 30, diaphragm vacuum side 32, void 34, definition gap 36, capacitor second surface 38, pressure cavity 40, pressure port 42, pedestal base 44, and pedestal pressure port 46. Also labeled in FIG. 1 are diaphragm thickness D, void height V, and definition gap height G. Base 12 and top 18 are composed of silicon and are electrically isolated from each other by glass frit 22, which is an electrical dielectric. Definition gap height G describes the thickness of glass frit 22, and will be described in more detail later in FIGS. 3A-3B. FIGS. 1 and 2-6 depict cross-sectional side views of capacitive MEMS pressure sensor 10 to show and describe the present disclosure, while appreciating that capacitive MEMS pressure sensor 10 has a three-dimensional structure. In an exemplary embodiment, base 12 and top 18 are square when viewed from the top (i.e., from a perspective that is perpendicular to that of FIG. 1). In other exemplary embodiments, base 12 and top 18 have rounded corners, or can be round, when viewed from the top. Accordingly, glass frit 22 bonds top 18 to base 12 surrounding the periphery of void 34. In an exemplary embodiment, trench 20 surrounds the periphery of top 18 such that top 18 is held in position relative to base 12. Trench 20 also isolates upper electrode 26, as will be described in more detail later. Base 12 and top 18 each include dopant impurities, thereby providing electrical conduction across the silicon material of base 12 and top 18. Accordingly, dopant impurities in the silicon of base 12 provide electrical conduction across diaphragm 28 between lower electrode 24 and diaphragm vacuum side 32. Dopant impurities in the silicon of top 18 similarly provide electrical conduction across top 18 between upper electrode 26 and capacitor second surface 38. Exemplary dopant impurities can be either p-type (i.e., acceptors) or n-type (i.e., donors). Non-limiting examples of p-type dopant impurities include boron, gallium, and indium. Non-limiting examples of n-type dopant impurities include phosphorus, arsenic, and antimony. A person having skill in the electrical semiconductor arts is knowledgeable of dopant impurities, their concentration, and the manner of applying dopant impurities to silicon. In an exemplary embodiment, dopant impurities can be applied in the regions of lower electrodes 24, upper electrodes 26, diaphragm 28, and capacitor second surface 38 to establish the aforementioned conduction paths.

Referring again to FIG. 1, void 34 is a vacuum and separates diaphragm 28 from top 18. More specifically, void 34 separates diaphragm vacuum side 32 from capacitor second surface 38, thereby forming an electrical capacitor. Accordingly, diaphragm vacuum side 32 can also be referred to as a capacitor first surface. In a condition as shown in FIG. 1 (i.e., without an applied system pressure), diaphragm vacuum side 32 (i.e., capacitor first surface) is separated from capacitor second surface 38 by void height V. The electrical capacitive value of the capacitor depends primarily on the surface areas of the capacitor first surface and capacitor second surface 38, void height V (i.e., capacitor plate separation), and the dielectric constant of the vacuum of void 34. During operation, a system pressure is applied to capacitive MEMS pressure sensor 10, fluidically communicating the system pressure to pressure cavity 40 via pressure port 42. The system pressure, in pressure cavity 40, acts on diaphragm relative to the vacuum of void 34, providing a force that deflects diaphragm 28 toward top 18, in turn reducing the separation between diaphragm vacuum side 32 (i.e., capacitor first surface) and capacitor second surface 38. Because the capacitive value varies in an inverse direction with the separation distance between a capacitor's surfaces, the applied system pressure causes an increase in electrical capacitive value of capacitive MEMS pressure sensor 10. An electrical circuit (not shown) applied to lower and upper electrodes 24, 26 can be configured to measure the capacitive value, thereby providing a representation of the value of the applied system pressure. Because void 34 is a vacuum, capacitive MEMS pressure sensor 10 provides an indication of an absolute pressure of the applied system pressure.

Capacitive MEMS pressure sensor 10 can be configured to measure a system pressure over a wide range of maximum values through the selection of various dimensions including the surface areas (not labeled) of diaphragm pressure side 30 and diaphragm vacuum side 32, diaphragm thickness D, and void height V. Theoretically there is no minimum or maximum limit on the value of system pressure that can measured by various embodiments of capacitive MEMS pressure sensor 10. In one exemplary embodiment, capacitive MEMS pressure sensor 10 can be configured to measure a system pressure up to about 1000 psi (6.9 MPa). In another exemplary embodiment, capacitive MEMS pressure sensor 10 can be configured to measure a system pressure up to more than 3000 psi (20.7 MPa). In yet another exemplary embodiment, capacitive MEMS pressure sensor 10 can be configured to measure a system pressure up to about 2 atmospheres (29.4 psi, or about 0.2 MPa). In yet another exemplary embodiment, capacitive MEMS pressure sensor 10 can be configured to measure a system pressure that is less than 1 psi (6,900 Pa). In view of the wide range of maximum system pressures that can be measured by capacitive MEMS pressure sensor 10, the physical dimensions can be different in various embodiments. In an exemplary embodiment, diaphragm thickness can range from about 200-500 μm, but can be less than 200 μm or more than 500 μm in various embodiments. In an exemplary embodiment, void height V can range from about 1-5 μm but can be less than 1 μm or more than 5 μm in various embodiments. In an exemplary embodiment, diaphragm cross-sectional area can range from about 0.25-4 square millimeters (i.e., from about $0.25 \times 10^{-6}$ $m^2$-$4 \times 10^{-6}$ $m^2$), but can be less than $0.25 \times 10^{-6}$ $m^2$ or more than $4 \times 10^{-6}$ $m^2$ in various embodiments.

Referring again to FIG. 1, base 12 is attached to pedestal base 44, which can help provide stress isolation between base 12 and an associated system. Pedestal base 44 has pedestal pressure port 46 which communicates the system pressure to capacitive MEMS pressure sensor 10 (i.e., via pressure port 42). In an exemplary embodiment, pedestal base 44 is a glass material that is bonded to base 12. Borosilicate glass is an exemplary glass material that can be used in pedestal base 44.

Figure 2:
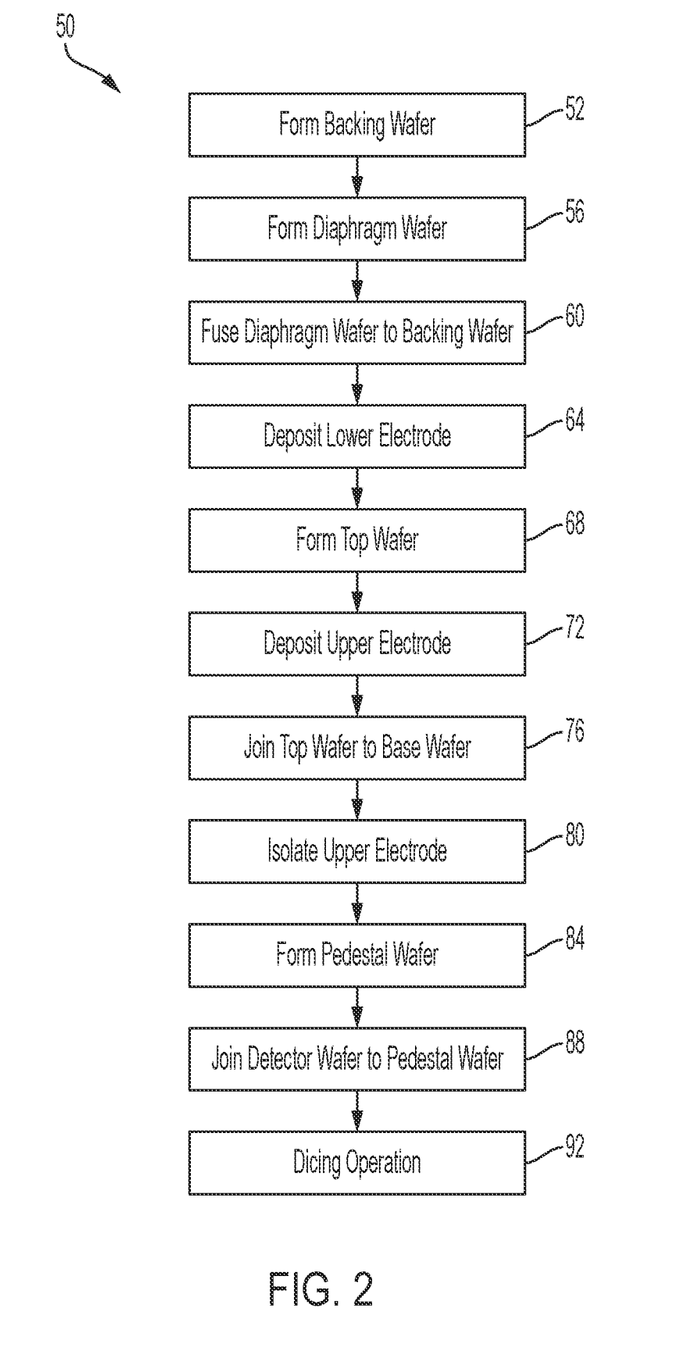
FIG. 2 is a process flow diagram showing some of the steps in manufacturing the capacitive MEMS pressure sensor shown in FIG. 1.

FIG. 2 is a process flow diagram showing some of the steps in manufacturing the capacitive MEMS pressure sensor shown in FIG. 1. Shown in FIG. 2 are process flow 50, which includes form backing wafer step 52, form diaphragm wafer step 56, fuse diaphragm wafer to backing wafer step 60, deposit lower electrode step 64, form top wafer step 68, deposit upper electrode step 72, join top wafer to base wafer step 76, isolate upper electrode step 80, form pedestal wafer step 84, join detector wafer to pedestal wafer step 88, and dicing operation step 92. Reference is to be made to process flow 50 shown in FIG. 2 while also reviewing FIGS. 3-7. In an exemplary embodiment, multiple capacitive MEMS pressure sensors 10 are fabricated simultaneously as a batch process by utilizing common wafers of silicon, etc. FIGS. 1 and 3-6 depict a single capacitive MEMS pressure sensor 10 at various stages of manufacture, while appreciating that in an exemplary process, wafer batch processing applies the various steps of process flow 50 to multiple capacitive MEMS pressure sensors 10 at various stages of manufacture. A person having skill in the semiconductor wafer fabrication art will have knowledge of wafer batch processing.

Figure 3A:
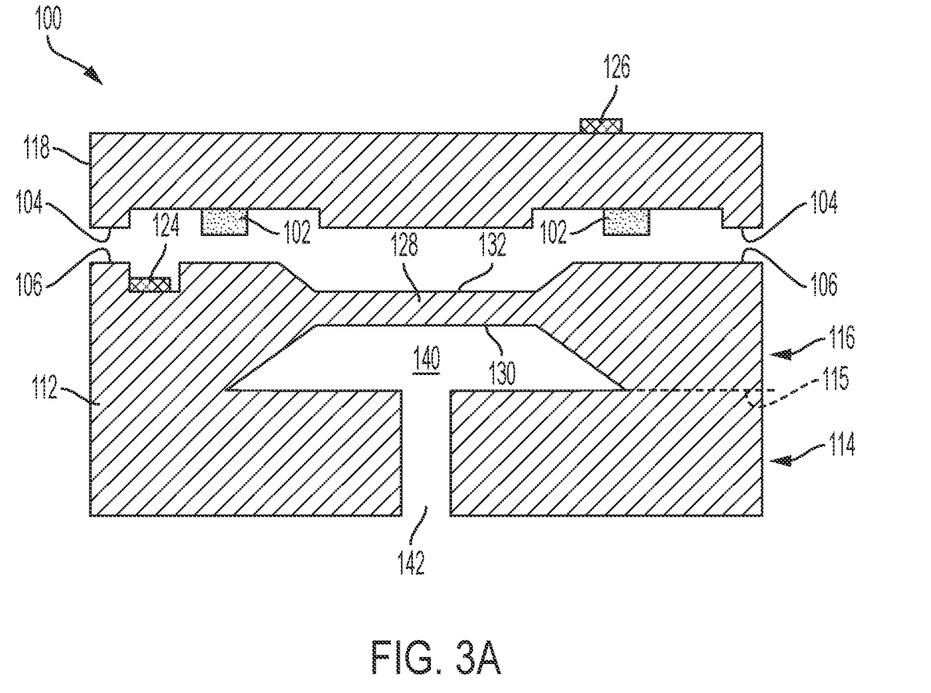
FIG. 3A is an exploded cross-sectional side view showing a diaphragm wafer and a backing wafer.
Figure 3B:
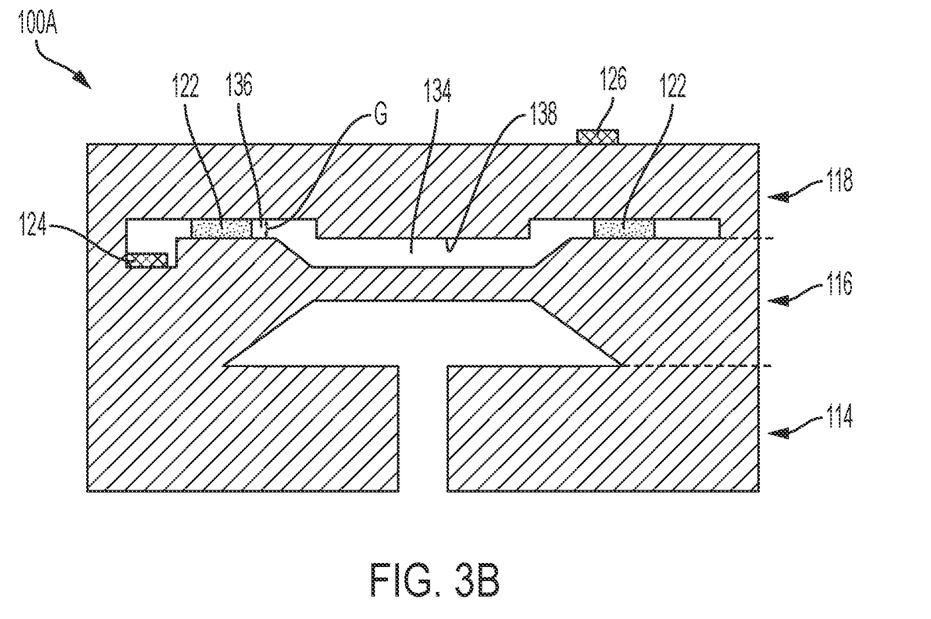
FIG. 3B is a cross-sectional side view showing the diaphragm wafer and a backing wafer shown in FIG. 3A.

FIG. 3A is an exploded cross-sectional side view showing a diaphragm wafer and a backing wafer. Shown in FIG. 3A are wafer work in process (WIP) 100, glass frit bead 102, alignment features 104, 106, base wafer 112, backing wafer 114, fusion plane 115, diaphragm wafer 116, top wafer 118, lower electrode 124, upper electrode 126, diaphragm 128, diaphragm pressure side 130, diaphragm vacuum side 132, pressure cavity 140, and pressure port 142. FIG. 3B is a cross-sectional side view showing the diaphragm wafer and the backing wafer shown in FIG. 3A. Shown in FIG. 3B are wafer WIP 100A, glass frit 122, void 134, definition gap 136, and capacitor second surface 138. Definition gap height G is also labeled in FIG. 3B. FIGS. 3A-3B will be described together, while making reference to process flow 50 shown in FIG. 2. In form backing wafer step 52, one or more backing wafers 114, including associated pressure ports 144, are formed from a silicon substrate using masking and etching processes that are known to those having skill in the wafer fabrication art. Backing wafer 114 is formed separately from diaphragm wafer 116 during form backing wafer step 52. In form diaphragm wafer step 56, one or more diaphragm wafers 116 are formed from a silicon substrate using masking and etching processes that are known to those having skill in the wafer fabrication art. Diaphragm 128 is formed by etching on both surfaces, thereby defining diaphragm pressure side 130 and diaphragm vacuum side 132, respectively, while also forming pressure cavity 140. The descriptions of diaphragm 128 and diaphragm thickness (not labeled in FIG. 3A) are substantially similar to those provided above in regard to FIG. 1. Alignment features 106 on diaphragm wafer 116 are also formed during form diaphragm wafer step 56. In an exemplary embodiment, dopant impurities can be introduced to diaphragm wafer 116 to provide the desired electrical conductivity properties, as described above in regard to FIG. 1. Next, in fuse diaphragm wafer to backing wafer step 60, diaphragm wafer 116 is fused to backing wafer 114 along fusion plane 115, thereby forming base wafer 112 as shown in FIG. 3A. An exemplary fusion process includes the application of pressure at an elevated temperature, thereby fusing the silicon material of backing wafer 114 and diaphragm wafer 116 together. In some embodiments, a thin adhesion layer can be used to fuse backing wafer 114 and diaphragm wafer 116 together. Exemplary adhesion layers include using metal or metal alloy, polymer glue, and glass frit.

Next, in deposit lower electrode step 64, an associated lower electrode 124 is deposited on each associated diaphragm wafer 116 using a metal deposition process that is known in the wafer fabrication art. Exemplary metals that can be used to form lower electrode 124 include aluminum, tungsten, titanium, chromium, gold, and/or alloys of these metals. In form top wafer step 68, top wafer 118 is formed from silicon while also forming alignment features 104 and capacitor second surface 138. Next, in deposit upper electrode step 72, an associated upper electrode 126 is deposited on each associated top wafer 118 using a metal deposition process that can be similar to that described in regard to deposit lower electrode step 64. Because top wafer 118 is formed independently from base wafer 112, form top wafer step 68 can occur earlier in process flow 50 than is shown in the illustrated embodiment.

In join top wafer to base wafer step 76, glass frit bead 102 is first applied to top wafer 118 and/or base wafer 112, thereby providing a fusion material that joins top wafer 118 to base wafer 112. In the illustrated embodiment, glass frit bead 102 is applied to top wafer 118 as shown in FIG. 3A. As applied, glass frit bead 102 has bead height B (shown in FIG. 3A) which is a greater value than that of definition gap height G (shown in FIG. 3B). Next, top wafer 118 is aligned with base wafer 112, while being pushed together such that alignment features 104 (on top wafer 118) contact with corresponding alignment features 106 (on diaphragm wafer 116). Accordingly, glass frit bead 102 is deformed, reducing the dimension of bead height B to that of definition gap G as shown in FIG. 3B, while positioning diaphragm vacuum side 132 relative to capacitor second surface 138 with a separation that is defined by void height V. During join top wafer to base wafer step 76, the compressed material of glass frit bead 102 is cured, thereby forming glass frit 122 which fuses top wafer 118 to with base wafer 112, thereby forming wafer WIP 100A as shown in FIG. 3B. In an exemplary embodiment, definition gap G (i.e., the height of glass frit 22) can range from about 10-20 µm. In some embodiments, definition gap G can be less than 10 µm or more than 20 µm, depending on the design of a particular embodiment. An important aspect of the present disclosure is the joining of alignment features 104 to associated alignment features 106, thereby allowing precision control of the height of definition gap G as shown in FIG. 3B, which in turn allows precision control of void height V. As noted above in regard to FIG. 1, the capacitive value of capacitive MEMS pressure sensor 10 is dependent on the value of void height V (i.e., the separation distance between diaphragm vacuum side 132 and capacitor second surface 138). Accordingly, process flow 50 and associated features of capacitive MEMS pressure sensor 10 of the present disclosure provides an extremely capable means of manufacturing capacitive MEMS pressure sensor 10 with a high degree of precision. This can improve the performance and accuracy of capacitive MEMS pressure sensor 10 and can also improve manufacturing yield and/or reduce costs. Because WIP wafer 100A includes the pressure detector elements of capacitive MEMS pressure sensor 10, WIP wafer 100A can also be referred to as a detector wafer.

Figure 4:
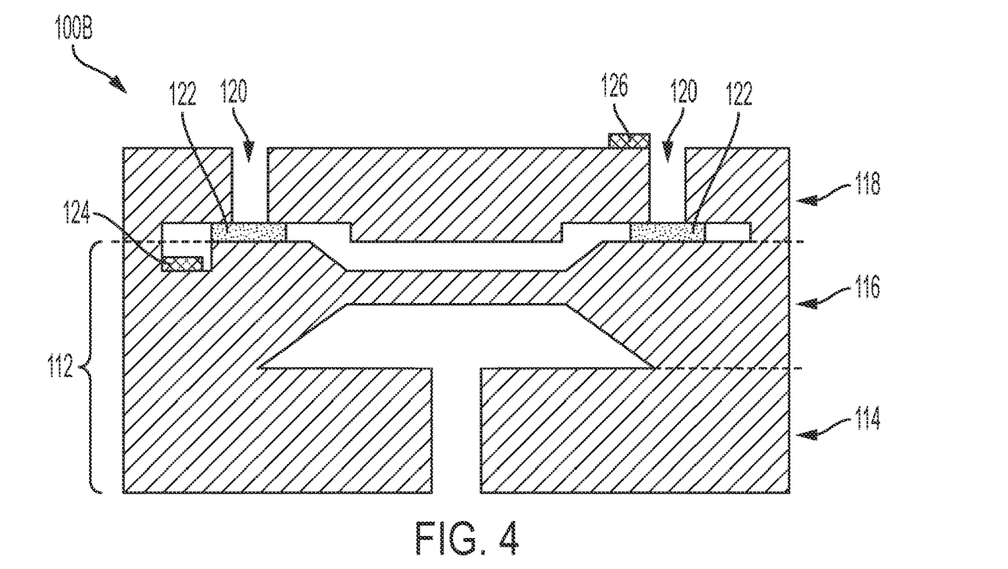
FIG. 4 is a cross-sectional side view showing the detector wafer shown in FIG. 3A.

FIG. 4 is a cross-sectional side view showing the detector wafer shown in FIG. 3A. Shown in FIG. 4 are WIP wafer 100B (i.e., detector wafer), base wafer 112, backing wafer 114, diaphragm wafer 116, top wafer 118, trench 120, glass frit 122, lower electrode 124, and upper electrode 126, all having descriptions substantially similar to those provided above in regard to FIGS. 1 and 3A-3B. Other previously described features of wafer WIP 100B are not labeled in FIG. 4 for ease of illustration. FIG. 4 will be described while making reference to process flow 50 shown in FIG. 2. Isolate upper electrode step 80 forms trench 120, thereby isolating upper electrode 126 from peripheral regions (not labeled) of top 118. In an exemplary embodiment, trench 120 can be formed by using a deep reactive ion etch (DRIE) process. DRIE and other wafer etching processes are known to those having skill in the wafer fabrication art.

Figure 5:
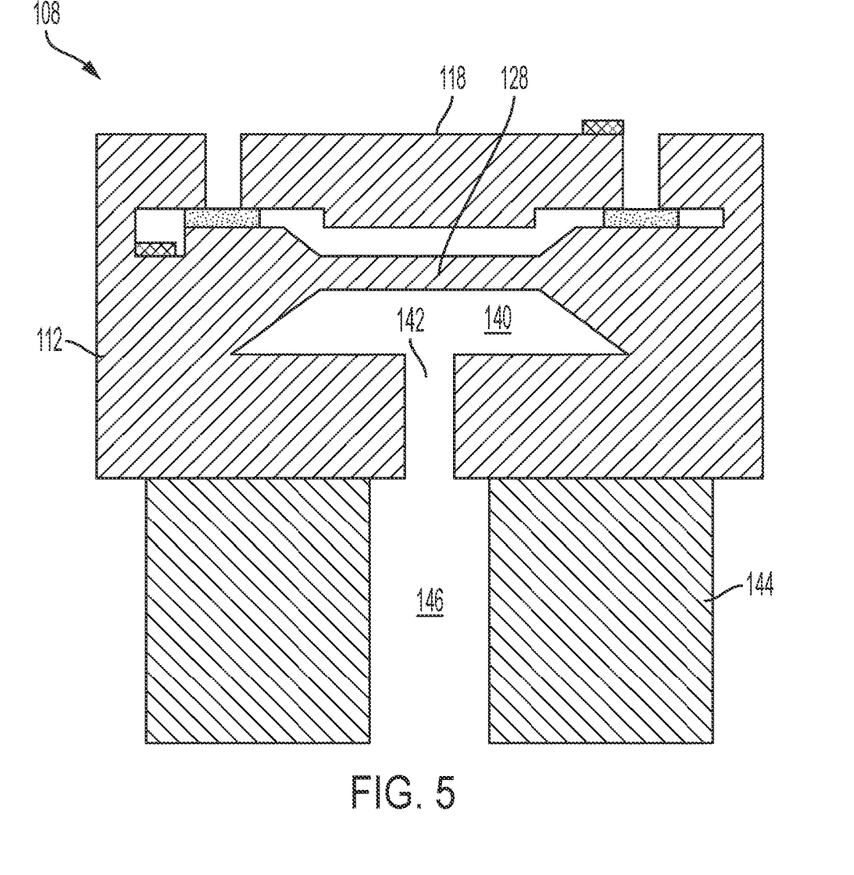
FIG. 5 is a cross-sectional side view showing the detector wafer shown in FIG. 4 joined to a pedestal wafer.

FIG. 5 is a cross-sectional side view showing the detector wafer shown in FIG. 4 joined to a pedestal wafer. Shown in FIG. 5 are wafer WIP 108 which includes base wafer 112, top wafer 118, diaphragm 128, pressure cavity 140, pressure port 142, pedestal base 144, and pedestal pressure port 146, all having descriptions substantially similar to those provided above in regard to FIGS. 1, 3A-3B, and 4. Other previously-described features of wafer WIP 108 are not labeled in FIG. 5 for ease of illustration. FIG. 5 will be described while making reference to process flow 50 shown in FIG. 2. Form pedestal wafer step 84 forms a number of pedestal bases 144, each with an associated pedestal pressure port 146, that are configured to be attached to WIP wafer 100B (i.e., detector wafer) shown in FIG. 4. Next, in join detector wafer to pedestal wafer step 88, each pedestal base 144 is bonded to an associated base wafer 112, with gold metallic bonding being an exemplary bonding process. Accordingly, each pedestal pressure port 146 aligns with an associated pressure port 142 such that a system pressure, when applied to pedestal base 144, fluidically communicates with pressure cavity 140 as described above in regard to FIG. 1. Pedestal base 144 is used in the exemplary embodiment to provide stress isolation between a system component (e.g., a pressure gauge line) and base wafer 112. In some embodiments, pedestal base 144 (i.e., and associated form pedestal wafer step 84 and join detector wafer to pedestal wafer step 88) can be omitted. In embodiments that include pedestal base 144, various materials can be used in pedestal base 144 (i.e., materials other than borosilicate glass as described above in FIG. 1). In yet other embodiments, a second base (not shown) in addition to pedestal base 144 can be used to further improve stress isolation between a system component and base wafer 112. The second base can be made of a material that has a coefficient of thermal expansion that is similar to that of pedestal base 144. In an exemplary embodiment in which pedestal base 144 is made of borosilicate glass, an exemplary material for the second base is an alloy of iron-nickel-cobalt (e.g., KOVAR™).

Figure 6:
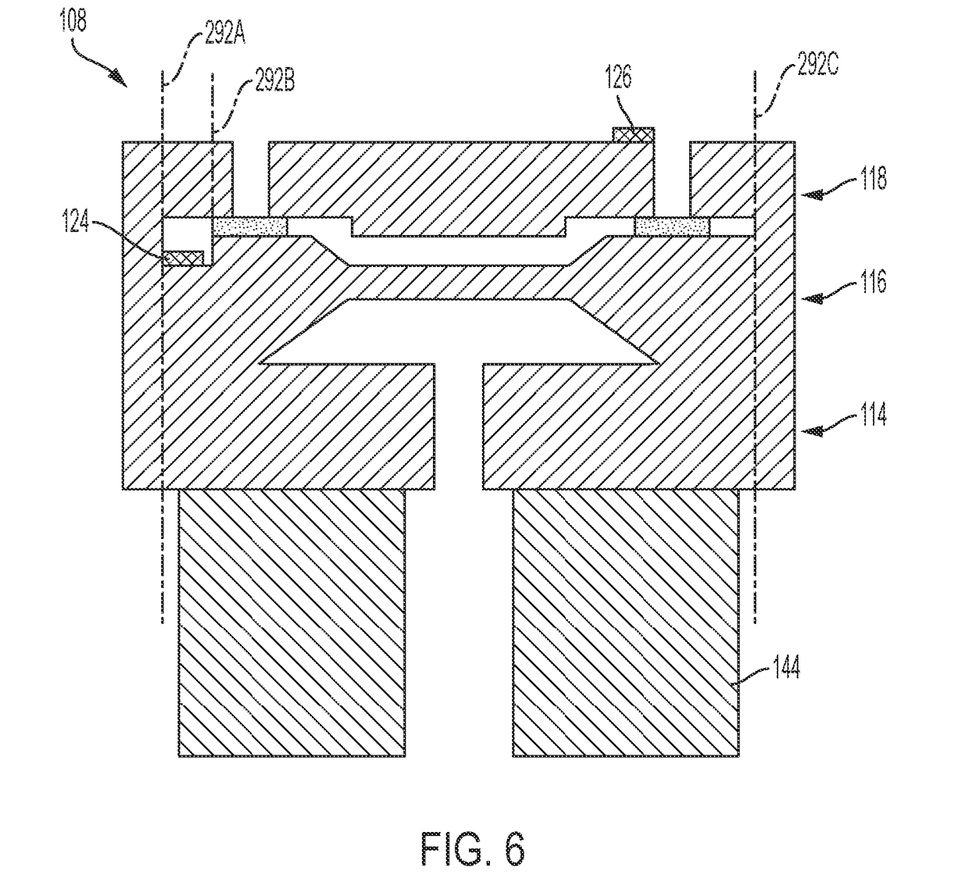
FIG. 6 is a cross-sectional side view showing dicing locations on the detector wafer shown in FIG. 5.

FIG. 6 is a cross-sectional side view showing dicing locations on WIP wafer 108 shown in FIG. 5. Shown in FIG. 6 are WIP wafer 108, base wafer 112, backing wafer 114, diaphragm wafer 116, top wafer 118, lower electrode 124, upper electrode 126, and pedestal base 144, each having a description that is substantially similar to those provide above in regard to FIGS. 1, 3A-3B, and 4-5. Also shown in FIG. 6 are dice lines 292A, 292B, and 292C. Other previously described features of wafer WIP 108 are not labeled in FIG. 6 for ease of illustration. FIG. 6 will be described while making reference to process flow 50 shown in FIG. 2. In dicing operation step 92, a series of dice lines 292A-292C are made in wafer WIP 108 to separate individual capacitive MEMS pressure sensors 10 from WIP wafer 108. Dice lines 292A and 292C are full dice lines, which cut through the full height of wafer WIP 108. Dice line 292B is a partial dice line (i.e., does not cut through the full height of wafer WIP 108). As shown in FIG. 6, dice lines 292A and 292B isolate lower electrode. An exemplary dicing operation uses a mechanical saw to cut through wafer WIP 108. In an exemplary process, partial dice lines (e.g., dice line 292B) are made first, followed by full dice lines (e.g., dice lines 292A and 292C). Dicing processes are known to those having skill in the wafer fabrication art. FIG. 6 depicts a two-dimensional cross-section of WIP wafer 108. In an exemplary embodiment, individual capacitive MEMS pressure sensors 10 are aligned in rows and columns on wafer WIP 108, as will be shown later in FIG. 7. Accordingly, dice lines 292A-292C will be made along orthogonal axes to each other, thereby separating individual capacitive MEMS pressure sensors 10 from associated rows and columns.

Figure 7:
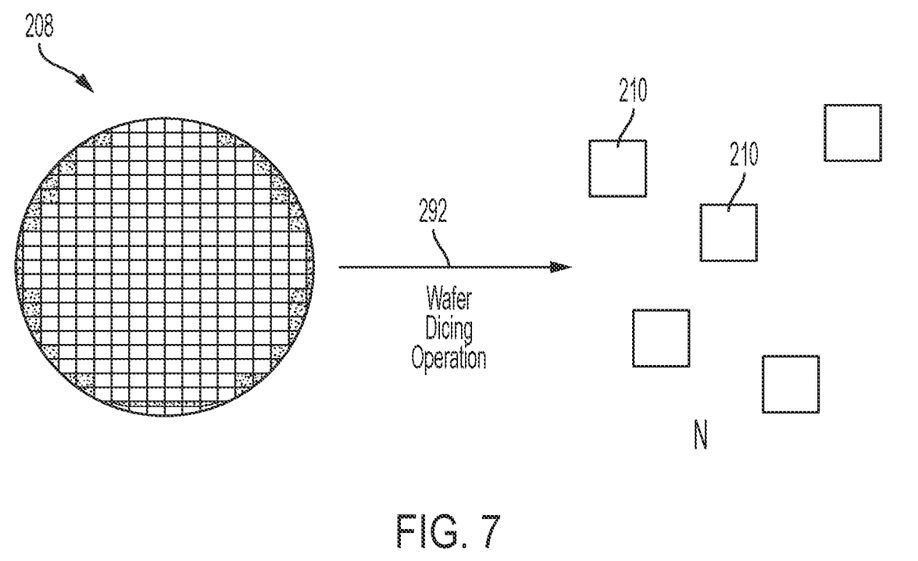
FIG. 7 is a top view showing a fully populated detector wafer.

FIG. 7 is a top view showing a fully populated detector wafer (i.e., a number of capacitive MEMS pressure sensors 10 on a full wafer). Shown in FIG. 7 are fully populated wafer 208, capacitive MEMS pressure sensors 210, and wafer dicing operation 292. In an exemplary embodiment, fully populated wafer 208 has a form factor that is known in the wafer fabrication art, with exemplary form factors being 100 mm, 150 mm, 200 mm, 300 mm, and 450 mm in diameter. Wafer dicing operation 292 separates individual capacitive MEMS pressure sensors 210 from fully populated wafer 208 in a manner substantially similar to that described above in regard to FIG. 6. Fully populated wafer 208 yields a number N of individual capacitive MEMS pressure sensors 210, with the number N being dependent on several factors including the form factor of fully populated wafer 208 and the physical dimensions of each capacitive MEMS pressure sensor 210. In an exemplary embodiment, fully populated wafer 208 having a 200 mm diameter can yield a number N of about 500 individual capacitive MEMS pressure sensors 210, but this number can be significantly different in various embodiments.

In the exemplary embodiment shown and described above in FIGS. 3A-3B and 4-7, multiple capacitive MEMS pressure sensors 10 were made in a batch process using wafer WIP 100, etc., because of the advantages of wafer batch processing using current tools of the art. All methods of manufacturing one or more capacitive MEMS pressure sensors 10 simultaneously are within the scope of the present disclosure. Moreover, one or more steps in process flow 50 shown in FIG. 2 can be modified to incorporate an individual component operation as opposed to a batch wafer operation, while remaining within the scope of the present disclosure. For example, in a particular embodiment, form pedestal wafer step 84 join detector wafer to pedestal wafer step 88 could be modified to a step that applies an individual pedestal base 44 to each associated wafer base 12. In an exemplary embodiment, an individual pedestal base 44 could be applied to one or more associated wafer bases 112 of wafer WIP 100B as shown in FIG. 5. In another exemplary embodiment, an individual pedestal base 44 could be applied to an individual capacitive MEMS pressure sensor 210 following wafer dicing operation 292 as shown in FIG. 7.

In the exemplary embodiments shown and described above, capacitive MEMS pressure sensor 10 is made of silicon (i.e., a semiconductor material) that has been doped with p-type and/or n-type dopant impurities to provide electrically conductive properties. In some embodiments, capacitive MEMS pressure sensor 10 can be made of other semiconductor materials with germanium and gallium arsenide being non-limiting examples. In other embodiments, capacitive MEMS pressure sensor 10 can be made of one or more metals or metal alloys, with non-limiting examples being copper, aluminum, iron, nickel, and/or alloys of these metals. In yet other embodiments, capacitive MEMS pressure sensor 10 can be made of a dielectric material, with non-limiting examples including quartz, silicon-carbide, and glass. In these embodiments, conductive or semi-conductive traces can be applied in the regions of lower electrodes 24, upper electrodes 26, diaphragm 28, and capacitor second surface 38 to establish electrical conduction paths that are similar to those described above in regard to FIG. 1.

Discussion of Possible Embodiments

The following are non-exclusive descriptions of possible embodiments of the present invention.

A method of fabricating a capacitive micromechanical electrical system (MEMS) pressure sensor, comprising the steps of: (a) forming a backing wafer; (b) forming a diaphragm wafer, the diaphragm wafer comprising: a diaphragm, configured to deflect from an applied force, the diaphragm defining a first capacitor surface; and a pressure cavity, configured to produce the applied force on the diaphragm, the applied force being indicative of a system pressure; (c) fusing the diaphragm wafer to the backing wafer, thereby forming a base wafer; (d) forming a top wafer, the top wafer defining a second capacitor surface; and (e) joining the top wafer to the base wafer, thereby forming a detector wafer, wherein: a void separates the second capacitor surface from the first capacitor surface; and a separation distance between the first capacitor surface and the second capacitor surface defines a capacitor gap.

The method of the preceding paragraph can optionally include, additionally and/or alternatively, any one or more of the following features, configurations and/or additional components:

A further embodiment of the foregoing method, wherein forming the backing wafer further comprises forming a pressure sensing port that is configured to fluidically communicate the system pressure to the pressure cavity.

A further embodiment of the foregoing method, wherein the diaphragm wafer and the top wafer are both made of a semiconductor material; the semiconductor material includes one or more dopant impurities configured to provide electrical conduction therethrough; forming the diaphragm wafer further comprises depositing a lower electrode on the diaphragm wafer, the lower electrode configured to provide an electrical connection to the first capacitor surface; and forming the top wafer further comprises depositing an upper electrode on the top wafer, the upper electrode configured to provide an electrical connection to the second capacitor surface.

A further embodiment of the foregoing method, wherein the semiconductor material is silicon.

A further embodiment of the foregoing method, wherein fusing the diaphragm wafer to the backing wafer comprises fusion bonding.

A further embodiment of the foregoing method, further comprising: isolating the upper electrode; wherein isolating the upper electrode comprises a deep etch process.

A further embodiment of the foregoing method, wherein joining the top wafer to the base wafer comprises glass frit bonding.

A further embodiment of the foregoing method, wherein: the top wafer further comprises a definition gap; and the definition gap is configured to control the capacitor gap.

A further embodiment of the foregoing method, wherein: the top wafer comprises one or more top wafer alignment features; the diaphragm wafer comprises one or more diaphragm wafer alignment features; and the one or more top wafer alignment features are configured to matingly contact the associated one or more diaphragm wafer alignment features, thereby defining the definition gap.

A further embodiment of the foregoing method, further comprising: removing the one or more top wafer alignment features and the one or more diaphragm wafer alignment features; and isolating the lower electrode.

A further embodiment of the foregoing method, further comprising: forming a pedestal wafer; and joining the detector wafer to the pedestal wafer.

A further embodiment of the foregoing method, further comprising a capacitive MEMS pressure sensor formed by the foregoing method.

A capacitive micromechanical electrical system (MEMS) pressure sensor, comprising: a backing wafer; a diaphragm wafer comprising: a diaphragm, configured to deflect from an applied force, the diaphragm defining a first capacitor surface; and a pressure cavity, configured to produce the applied force on the diaphragm, the applied force being indicative of a system pressure; and a top wafer, the top wafer defining a second capacitor surface; wherein: the top wafer is joined to the diaphragm wafer, thereby defining a void separating the second capacitor surface from the first capacitor surface; and a separation distance between the first capacitor surface and the second capacitor surface defines a capacitor gap.

The capacitive MEMS pressure sensor of the preceding paragraph can optionally include, additionally and/or alternatively, any one or more of the following features, configurations and/or additional components:

A further embodiment of the foregoing capacitive MEMS pressure sensor, wherein: the backing wafer further comprises forming a pressure sensing port that is configured to fluidically communicate the system pressure to the pressure cavity.

A further embodiment of the foregoing capacitive MEMS pressure sensor, wherein: the diaphragm wafer and the top wafer are both made of a semiconductor material; the semiconductor material includes one or more dopant impurities configured to provide electrical conduction therethrough; the diaphragm wafer further comprises a lower electrode configured to provide an electrical connection to the first capacitor surface; and the top wafer further comprises an upper electrode configured to provide an electrical connection to the second capacitor surface.

A further embodiment of the foregoing capacitive MEMS pressure sensor, wherein the semiconductor material is silicon.

A further embodiment of the foregoing capacitive MEMS pressure sensor, wherein: the top wafer further comprises a definition gap; and the definition gap is configured to control the capacitor gap.

A further embodiment of the foregoing capacitive MEMS pressure sensor, further comprising a pedestal wafer joined to the backing wafer.

A further embodiment of the foregoing capacitive MEMS pressure sensor, wherein: the top wafer comprises one or more top wafer alignment features; the diaphragm wafer comprises one or more diaphragm wafer alignment features; and the one or more top wafer alignment features are configured to matingly contact the associated one or more diaphragm wafer alignment features.

A further embodiment of the foregoing capacitive MEMS pressure sensor, wherein the one or more top wafer alignment features and the one or more diaphragm wafer alignment features are configured to be removed by a dicing operation.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of fabricating a capacitive micromechanical electrical system (MEMS) pressure sensor, comprising the steps of:
   forming a backing wafer;
   forming a diaphragm wafer, the diaphragm wafer comprising:
      a diaphragm, configured to deflect from an applied force, the diaphragm defining a first capacitor surface; and
      a pressure cavity, configured to produce the applied force on the diaphragm, the applied force being indicative of a system pressure;
      wherein:
         the diaphragm wafer is made of a semiconductor material;
         the semiconductor material includes one or more dopant impurities configured to provide electrical conduction therethrough;
         forming the diaphragm wafer comprises depositing a lower electrode on the diaphragm wafer, the lower electrode configured to provide an electrical connection to the first capacitor surface;
   fusing the diaphragm wafer to the backing wafer, thereby forming a base wafer, wherein the diaphragm wafer comprises one or more diaphragm wafer alignment features;
   forming a top wafer, the top wafer defining a second capacitor surface, wherein:
      the top wafer comprises one or more top wafer alignment features;
      the top wafer further comprises a definition gap;
      the top wafer is made of the semiconductor material;

the semiconductor material includes one or more dopant impurities configured to provide electrical conduction therethrough; and forming the top wafer further comprises depositing an upper electrode on the top wafer, the upper electrode configured to provide an electrical connection to the second capacitor surface;

joining the top wafer to the base wafer, thereby forming a detector wafer, wherein:

a void separates the second capacitor surface from the first capacitor surface; and a separation distance between the first capacitor surface and the second capacitor surface defines a capacitor gap;

the one or more top wafer alignment features are configured to matingly contact the associated one or more diaphragm wafer alignment features, thereby defining the definition gap;

the definition gap is configured to control the capacitor gap; and joining the top wafer to the base wafer forms an adhesion layer between the top wafer and the base wafer; and removing the one or more top wafer alignment features and the one or more diaphragm wafer alignment features after joining the top wafer to the base wafer.

2. The method of claim 1, wherein forming the backing wafer further comprises forming a pressure sensing port that is configured to fluidically communicate the system pressure to the pressure cavity.

3. The method of claim 1, wherein the semiconductor material is silicon.

4. The method of claim 1, wherein fusing the diaphragm wafer to the backing wafer comprises fusion bonding.

5. The method of claim 1, further comprising:
isolating the upper electrode;
wherein isolating the upper electrode comprises a deep etch process.

6. The method of claim 1, wherein joining the top wafer to the base wafer comprises glass frit bonding.

7. The method of claim 1, further comprising:
forming a pedestal wafer; and
joining the detector wafer to the pedestal wafer.

8. A capacitive MEMS pressure sensor formed by the method of claim 1.

9. A capacitive micromechanical electrical system (MEMS) pressure sensor, comprising:
a backing wafer;
a diaphragm wafer comprising:
a diaphragm, configured to deflect from an applied force, the diaphragm defining a first capacitor surface; and
a pressure cavity, configured to produce the applied force on the diaphragm, the applied force being indicative of a system pressure; and a top wafer, the top wafer defining a second capacitor surface;
wherein:
the top wafer is joined to the diaphragm wafer by an adhesion layer disposed therebetween, thereby defining a void separating the second capacitor surface from the first capacitor surface; and
a separation distance between the first capacitor surface and the second capacitor surface defines a capacitor gap;
the top wafer comprises one or more top wafer alignment features;
the diaphragm wafer comprises one or more diaphragm wafer alignment features;
the one or more top wafer alignment features are configured to matingly contact the associated one or more diaphragm wafer alignment features; and
the one or more top wafer alignment features and the one or more diaphragm wafer alignment features are configured to be removed by a dicing operation.

10. The capacitive MEMS pressure sensor of claim 9, wherein:
the backing wafer further comprises forming a pressure sensing port that is configured to fluidically communicate the system pressure to the pressure cavity.

11. The capacitive MEMS pressure sensor of claim 9, wherein:
the diaphragm wafer and the top wafer are both made of a semiconductor material;
the semiconductor material includes one or more dopant impurities configured to provide electrical conduction therethrough;
the diaphragm wafer further comprises a lower electrode configured to provide an electrical connection to the first capacitor surface; and
the top wafer further comprises an upper electrode configured to provide an electrical connection to the second capacitor surface.

12. The capacitive MEMS pressure sensor of claim 11, wherein the semiconductor material is silicon.

13. The capacitive MEMS pressure sensor of claim 9, wherein:
the top wafer further comprises a definition gap; and
the definition gap is configured to control the capacitor gap.

14. The capacitive MEMS pressure sensor of claim 9, further comprising a pedestal wafer joined to the backing wafer.

15. The method of claim 1, wherein:
the lower electrode is electrically connected to the top wafer before the wafer alignment features are removed; and
removing the one or more wafer alignment features and the one or more diaphragm wafer alignment features isolates the lower electrode.

* * * * *